United States Patent
Nyhus et al.

(10) Patent No.: US 9,530,688 B2
(45) Date of Patent: Dec. 27, 2016

(54) DIRECTED SELF ASSEMBLY OF BLOCK COPOLYMERS TO FORM VIAS ALIGNED WITH INTERCONNECTS

(71) Applicants: Paul A. Nyhus, Portland, OR (US); Swaminathan Sivakumar, Beaverton, OR (US); Robert Bristol, Portland, OR (US)

(72) Inventors: Paul A. Nyhus, Portland, OR (US); Swaminathan Sivakumar, Beaverton, OR (US); Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/822,865

(22) Filed: Aug. 10, 2015

(65) Prior Publication Data

US 2015/0348839 A1     Dec. 3, 2015

Related U.S. Application Data

(63) Continuation of application No. 13/631,197, filed on Sep. 28, 2012, now Pat. No. 9,153,477.

(51) Int. Cl.
*H01L 21/4763* (2006.01)
*H01L 21/768* (2006.01)
(Continued)

(52) U.S. Cl.
CPC ..... *H01L 21/76877* (2013.01); *H01L 21/0337* (2013.01); *H01L 21/31144* (2013.01);
(Continued)

(58) Field of Classification Search
CPC ..................................................... H01L 21/768
(Continued)

(56) References Cited

U.S. PATENT DOCUMENTS 7,993,816 B2 *  8/2011  Black ................ B82Y 10/00
                                                         430/311
8,641,914 B2 *  2/2014  Regner ................... B05D 1/34
                                                         216/17
(Continued)

FOREIGN PATENT DOCUMENTS

CN      1511625       7/2004
CN    101165874       4/2008
(Continued)

OTHER PUBLICATIONS

International Preliminary Report on Patentability from PCT/US2013/060455 mailed Apr. 9, 2015, 7 pgs.
(Continued)

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

A method of an aspect includes forming an interconnect line etch opening in a hardmask layer. The hardmask layer is over a dielectric layer that has an interconnect line disposed therein. The interconnect line etch opening is formed aligned over the interconnect line. A block copolymer is introduced into the interconnect line etch opening. The block copolymer is assembled to form a plurality of assembled structures that are spaced along a length of the interconnect line etch opening. An assembled structure is directly aligned over the interconnect line that is disposed within the dielectric layer.

14 Claims, 10 Drawing Sheets

(51) Int. Cl.
   *H01L 23/522* (2006.01)
   *H01L 21/033* (2006.01)
   *H01L 21/311* (2006.01)

(52) U.S. Cl.
   CPC .. *H01L 21/76811* (2013.01); *H01L 21/76816* (2013.01); *H01L 23/5226* (2013.01); *H01L 2924/0002* (2013.01)

(58) Field of Classification Search
   USPC .................................. 257/774; 438/618, 637
   See application file for complete search history.

(56) References Cited

U.S. PATENT DOCUMENTS

| | | | |
|---|---|---|---|
| 2004/0175932 A1 | 9/2004 | Kim et al. | |
| 2007/0200477 A1 | 8/2007 | Tuominen et al. | |
| 2007/0293041 A1 | 12/2007 | Yang et al. | |
| 2008/0093743 A1* | 4/2008 | Yang | B81C 1/00095 257/758 |
| 2008/0193658 A1* | 8/2008 | Millward | B81C 1/00031 427/401 |
| 2008/0217292 A1* | 9/2008 | Millward | B82Y 30/00 216/46 |
| 2008/0265409 A1 | 10/2008 | Liu et al. | |
| 2009/0206489 A1* | 8/2009 | Li | H01L 21/0337 257/774 |
| 2012/0223052 A1 | 9/2012 | Regner | |

FOREIGN PATENT DOCUMENTS

| | | |
|---|---|---|
| JP | 2011018778 | 1/2011 |
| JP | 2011077475 | 4/2011 |
| KR | 102010012392 | 4/2013 |

OTHER PUBLICATIONS

Office Action for Korean Patent Application No. 10-2015-7003807, mailed Feb. 2, 2016, 7 pgs.

Office Action for Taiwanese Patent Application No. 102134747, mailed Oct. 22, 2015, 12 pgs.

Final Office Action from U.S. Appl. No. 13/631,197 mailed Nov. 18, 2014, 18 pgs.

Non-Final Office Action from U.S. Appl. No. 13/631,197 mailed May 20, 2014, 18 pgs.

International Search Report and Written Opinion for PCT Application No. PCT/US2013/060455 mailed Dec. 30, 2013 pgs.

Extended European Search Report for European Application No. 13840290.4 mailed May 30, 2016, 7 pgs.

First Office Action from Chinese Patent Application No. 201380045245.X mailed Aug. 16, 2016, 11 pgs.

* cited by examiner

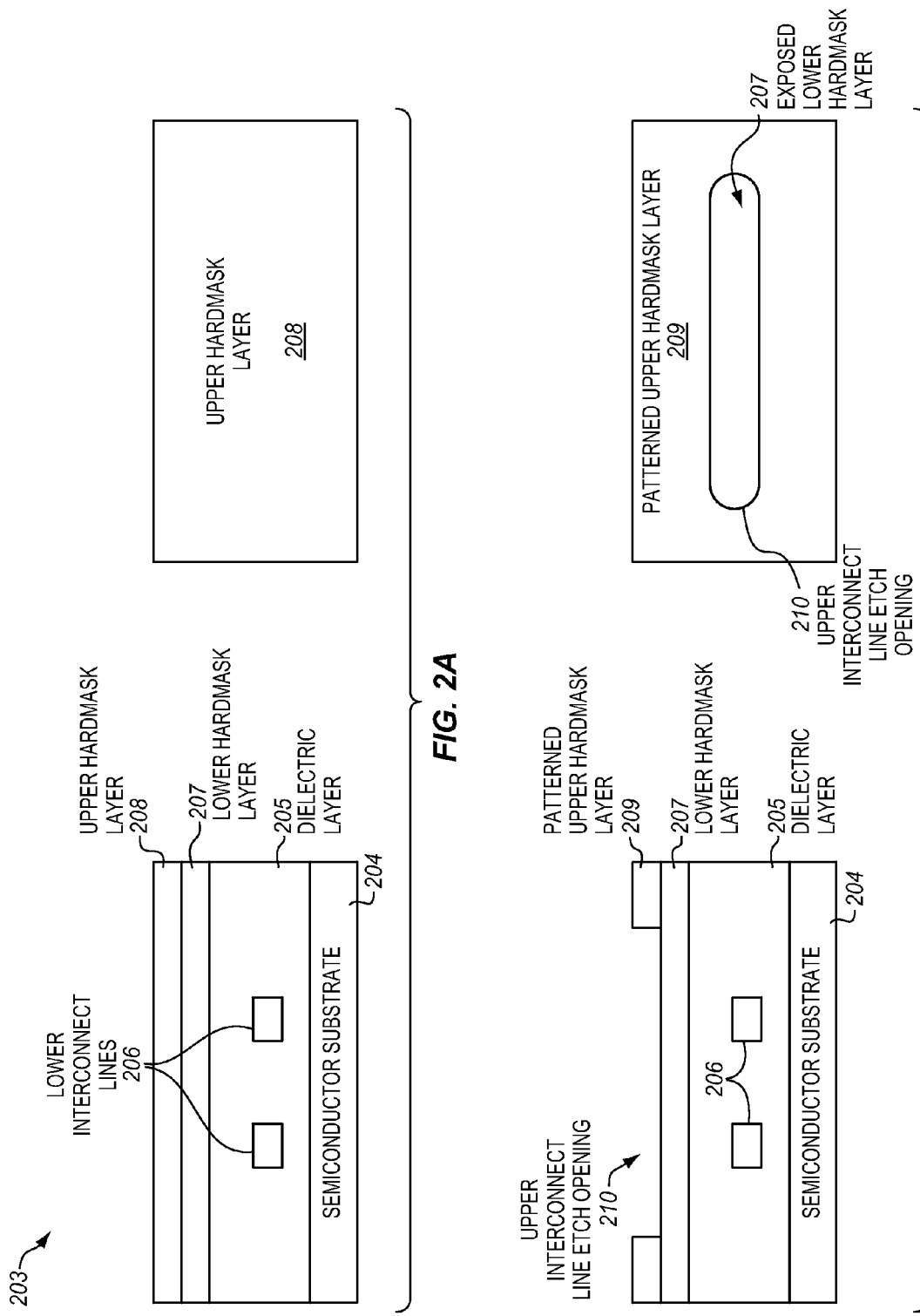

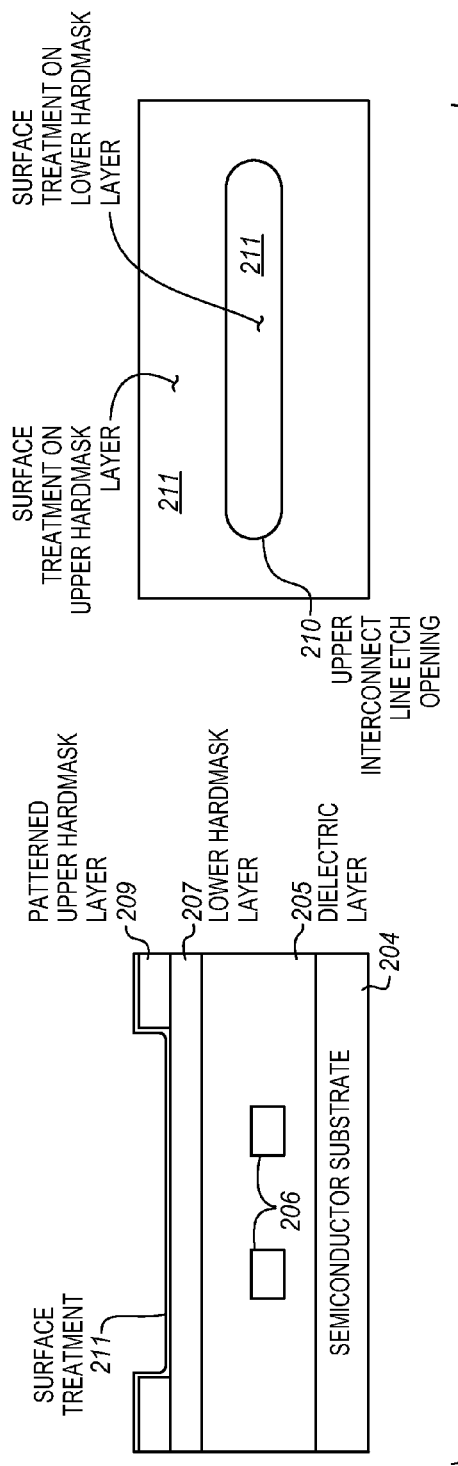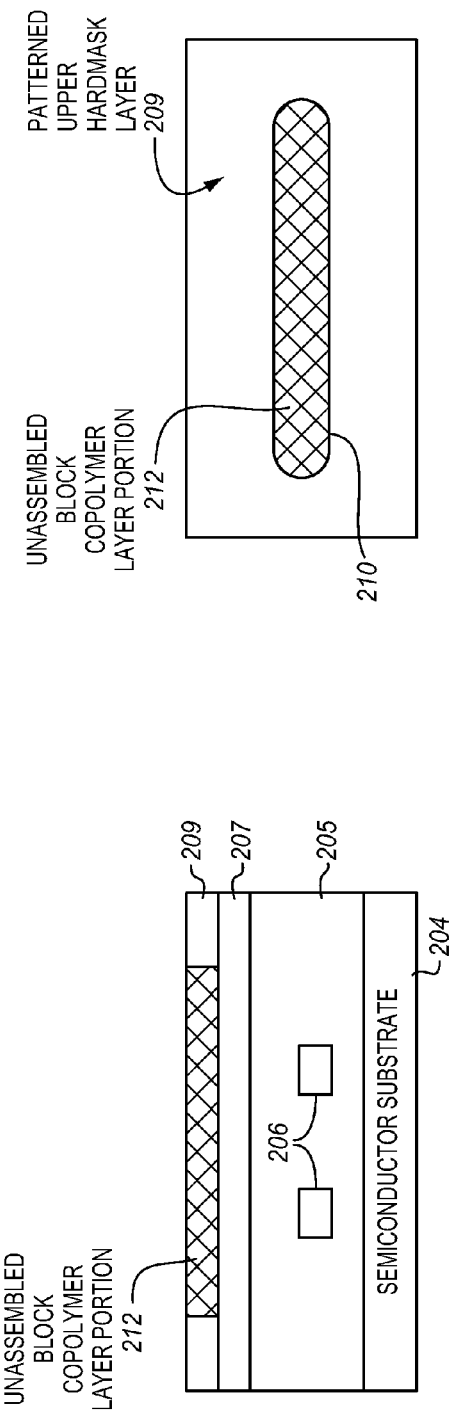
FIG. 2C
FIG. 2D

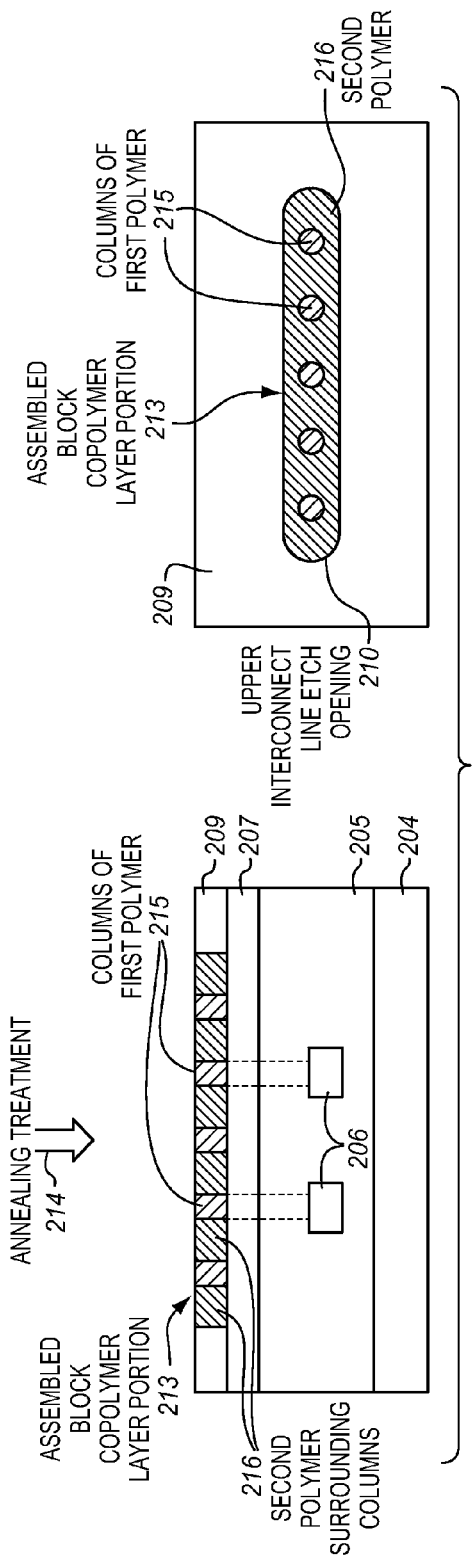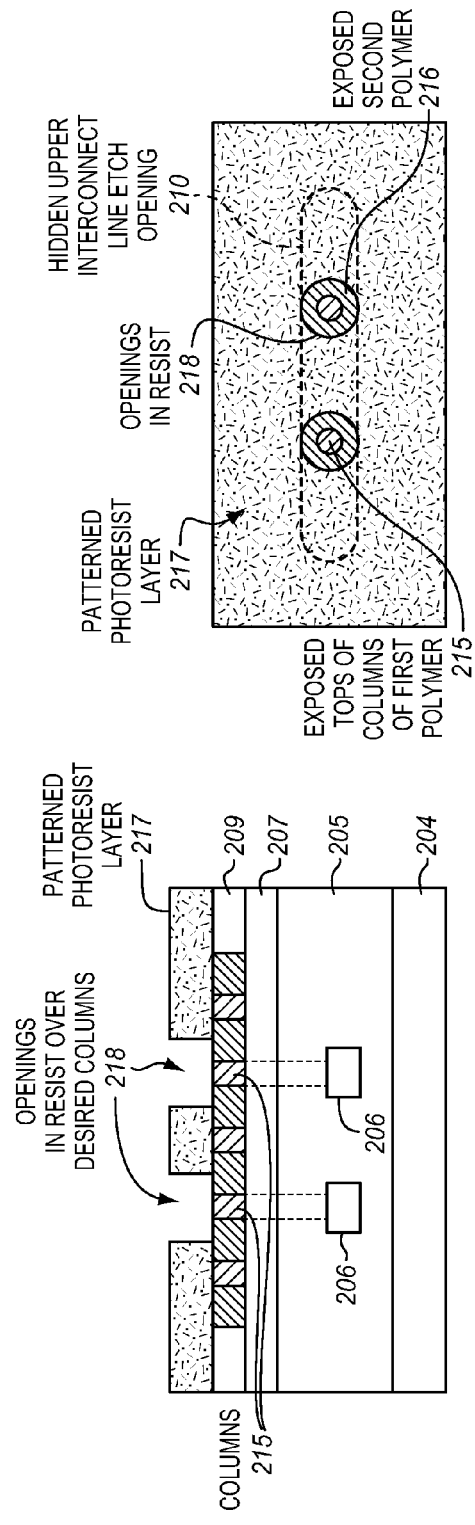

DIRECTED SELF ASSEMBLY OF BLOCK COPOLYMERS TO FORM VIAS ALIGNED WITH INTERCONNECTS

CROSS-REFERENCE TO RELATED APPLICATIONS

This application is a continuation of U.S. patent application Ser. No. 13/631,197, filed on Sep. 28, 2012, the entire contents of which are hereby incorporated by reference herein.

BACKGROUND

Field

Embodiments relate to the field of integrated circuit manufacture. In particular, embodiments relate to forming openings for vias in integrated circuit manufacture.

Background Information

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 2A-J illustrate portions of integrated circuit substrates representing different stages of a first embodiment of a method of forming via openings, which are self aligned with interconnects, utilizing self assembly of a block copolymer.

DETAILED DESCRIPTION

In the following description, numerous specific details, such as specific types of block copolymers, specific interconnect structures, specific orders of operations, specific materials, and the like, are set forth. However, it is understood that embodiments of the invention may be practiced without these specific details. In other instances, well-known structures and techniques have not been shown in detail in order not to obscure the understanding of this description.

Figure 1:
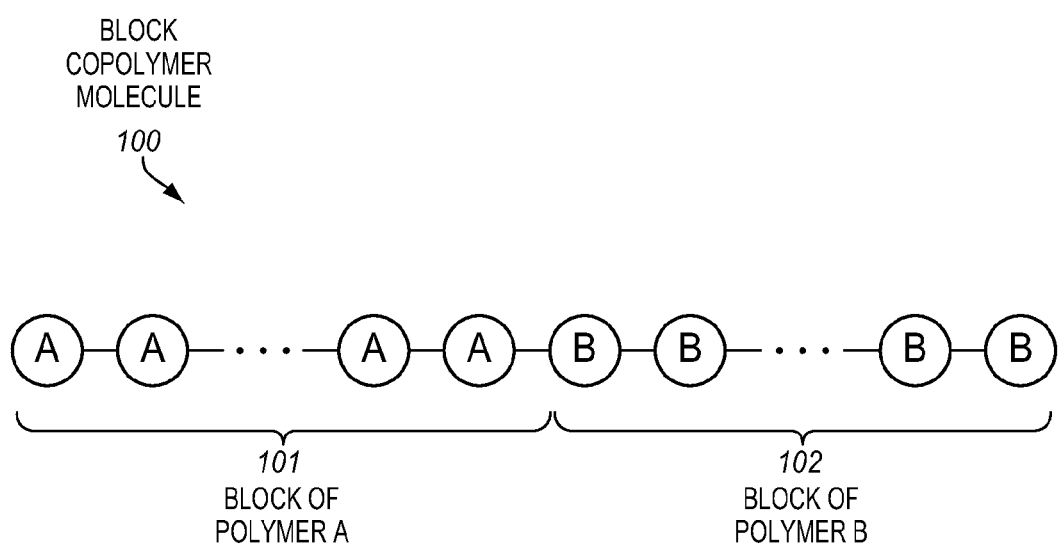
FIG. 1 illustrates a block copolymer molecule.

FIG. 1 illustrates a block copolymer molecule 100. The block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer A 101 and a block of polymer B 102. The block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments there may more than two blocks. Moreover, in other embodiments, each of the blocks may include different types of monomers (e.g., each block may itself be a copolymer). The block of polymer A and the block of polymer B are covalently bonded together. The block of polymer A and the block of polymer B may be of approximately equal length, or one block may be significantly longer than the other.

Typically, the blocks of block copolymers (e.g., the block of polymer A and the block of polymer B) may each have different chemical properties. As one example, one of the blocks may be relatively more hydrophobic (e.g., water disliking) and the other may be relatively more hydrophilic (water liking). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, because the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. By way of example, in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer A 101 were longer than the block of polymer B 102, but not too much longer, columnar structures may formed in which many block copolymer molecules align with their shorter blocks of polymer B 102 forming columnar structures surrounded by a phase having the longer blocks of polymer A 101. When this occurs in an area of sufficient size, a two-dimensional array of generally hexagonally-packed columnar structures may be formed.

As will be explained further below, in some embodiments, self-assembly of block copolymers, whether based on hydrophobic-hydrophilic differences or otherwise, may be used to form extremely small periodic structures (e.g., precisely spaced nano-scale structures). In some embodiments, they may be used to form nano-scale columns or other nano-scale structures that can be used to form via openings. In some embodiments, directed self assembly of block copolymers may be used to form vias that are self aligned with interconnects.

FIG. 2A-J illustrate portions of integrated circuit substrates representing different stages of an embodiment of a method of forming via openings, which are self aligned with interconnects, utilizing self assembly of a block copolymer. In each illustration at each stage, cross-sectional views are shown on the left-hand side, and corresponding top-planar views at the same stage are shown on the right-hand side. These views will be referred to herein as corresponding cross-sectional views and top-planar views.

FIG. 2A illustrates an integrated circuit substrate 203 at a first stage of the method. In the cross-sectional view (on the left in the illustration), the integrated circuit substrate 203 includes a semiconductor substrate 204, a dielectric layer 205 formed over the semiconductor substrate 204, a lower hardmask layer 207 formed over the dielectric layer 205, and an upper hardmask layer 208 formed over the lower hardmask layer 207. As used herein, a first layer being "over" a second layer encompasses the first layer being directly "on" the second layer as well as the first layer being "over" the second layer but separated from the second layer by one or more intervening layers or materials. In the top-planar view of FIG. 2A (on the right in the illustration), only the top surface of the upper hardmask layer 208 is visible.

The semiconductor substrate 204 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates.

The dielectric layer 205 includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The dielectric layer may be formed by conventional techniques, such as, for example, Chemical Vapor Deposition (CVD), Physical Vapor Deposition (PVD), or by other deposition methods.

Lower interconnect lines 206 are disposed within the dielectric layer. For example, the lower interconnect lines may extend elongated into the plane of the page of the illustration. The lower interconnect lines may represent one or more metal or other conductive structures. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used as landings and/or etch stops for via openings formed over the lower interconnect lines.

The upper and lower hardmask layers 207, 208 each include a different hardmask material so as to provide different etch selectivity to each other and to the underlying dielectric layer. In some embodiments, one of the hardmask layers (e.g., the upper hardmask layer) may include a layer of a nitride of silicon (e.g., silicon nitride), and another of the hardmask layers (e.g., the lower hardmask layer) may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular etches used. Various conventional pairs of hardmask layers known in the arts are suitable for their corresponding known etches. The hardmask layers maybe formed by CVD, PVD, or by other deposition methods.

FIG. 2B illustrates the integrated circuit substrate of FIG. 2A after forming an upper interconnect line etch opening 210 in the upper hardmask layer 208 in order to form a patterned upper hardmask layer 209. As shown in the cross-sectional view (on the left), the upper interconnect line etch opening 210 extends through the upper hardmask layer 209 and ends at or around the lower hardmask layer 207. In some embodiments, the upper interconnect line etch opening may be formed lithographically. For example, a photoresist layer may be spin coated over the upper hardmask layer 208, the photoresist layer may be lithographically patterned and developed to form an opening in the photoresist layer, the upper interconnect line etch opening 210 may be etched through the opening in the photoresist layer, and the photoresist layer may be stripped or otherwise removed.

In the top-planar view (on the right), the top surface of the patterned upper hardmask layer 209 is visible. The top surface of the lower hardmask layer 207 is exposed through the opening 210. In the illustrated embodiment, the shape of the upper interconnect line etch opening 210 has a narrow and elongated shape. This upper interconnect line etch opening will eventually be used to perform an etch for upper interconnects that are to be formed over the lower interconnects 206. In one aspect, the upper interconnect line etch opening may have the general size and shape of the upper interconnect line that is to be formed. In some embodiments, a width of the upper interconnect line etch opening may be approximately equal to an intended width of an upper interconnect line. In some embodiments, the width of the opening may be less than about 40 nm or in some cases less than about 30 nm, although the scope of the invention is not so limited. In some embodiments, a length of the upper interconnect line etch opening may be approximately equal to an intended length of an upper interconnect line. In some embodiments, the length of the opening may range from about equal to a width of the interconnect line etch opening (e.g., around 30-40 nm or less) up to any appropriate length of an interconnect line (e.g., on the order of tends of times the width of the interconnect line), although the scope of the invention is not so limited. In addition, as will be explained further below, the upper interconnect line etch opening will also be used to corral or contain block copolymer during self reassembly. Significantly, the copolymer within the opening may align to the dimensions of the opening and therefore to the final etched upper interconnects. In one aspect, the narrow and elongated shape is generally perpendicular to an elongation direction of the lower interconnect lines 206.

FIG. 2C illustrates the integrated circuit substrate of FIG. 2B after optionally applying a surface treatment 211 to the exposed upper surface of the patterned upper hardmask layer 209. The cross-sectional view (on the left) show that the surface treatment 211 covers the patterned upper hardmask layer and the opening therein including on exposed surface of the lower hardmask layer at the bottom of the opening. In the top-planar view (on the right) the surface treatment 211 is shown over the patterned upper hardmask layer and over the exposed portion of the hardmask layer within the upper interconnect line etch opening. In an alternate embodiment, the surface treatment may instead optionally be provided selectively within the upper interconnect line etch opening over the exposed portion of the hardmask layer but not over the patterned upper hardmask layer.

In some embodiments, the surface treatment may be a conformal brush material or thin layer. In some embodiments, the optional surface treatment or conformal brush layer may help to make at least some or all of the surfaces, which are intended to come into contact with the block copolymer, chemically neutral, or at least relatively more neutral, to the different polymer blocks of the block copolymer (e.g., to their chemical properties). If the block copolymer were to contact a significantly non-neutral surface, meaning a surface that has a greater interaction tendency (e.g., repulsive or attractive) with one polymer block than with another, then the non-neutral surface would tend to influence the self-assembly in a way that may not be desired. The surface treatment may help to make the surface(s) at least more neutral and/or make the surface interaction tendency more similar relative to the different polymer blocks. Of course, when dealing with real materials, perfect neutrality may not be practically achievable. It is sufficient to perform a surface treatment to at least make the surface more neutral. The surface treatment may help to make the surfaces energetically more favorable for desired self-assembled structures to form, or at least not interfere with tendency to self assemble to form these structures. Moreover, such a surface treatment will often be desirable, but is not required (e.g., if the surface is already sufficiently neutral for the particular block copolymer or otherwise sufficiently neutral for the particular implementation).

In some embodiments, the surface treatment or conformal brush layer may be an application of a material having a chemical property that is intermediate between the polymer blocks. In some embodiments, the surface treatment and/or the conformal brush material or layer may be applied by spin coating, spray coating, dipping coating, immersion coating, or otherwise depositing or applying a relatively thin coating of a material that has a chemical property (e.g., a hydrophilicity) that is approximately half way between, or at least intermediate between, corresponding chemical properties of the different polymer blocks. One example of a suitable surface treatment or conformal brush coating is a coating of a copolymer that has alternating monomers of the different block copolymers. For example, for a block copolymer including a block of polymer A and a block of polymer B, the surface treatment may include a coating or thin layer of a copolymer of A and B where the monomers A and B are highly mixed within the copolymer (e.g., A-B-A-B-A-B-A-B-A-B, A-A-B-B-B-A-B-B-A-A-A, etc.). Another example of a suitable surface treatment or conformal brush coating is an organic coating (whether polymeric or otherwise) that has a chemical property (e.g., a hydrophilic/hydrophobic property) intermediate between the polymer blocks. The chemical property generally should be one that significantly affects the self assembly. Alternatively, rather than applying a material, other types of surface treatments may potentially be used that modify the surface in some way (e.g., oxidize the surface, de-oxidize the surface, etc.). The surface treatment 211 is optional and not required for other implementations.

FIG. 2D illustrates an unassembled block copolymer layer portion 212 applied to the integrated circuit substrate of FIG. 2C. As shown in the cross-sectional view, the unassembled block copolymer layer portion resides on top of the optional surface treatment within the upper interconnect line etch opening. As shown in the top-planar view, the patterned upper hardmask layer 209 is visible, and in some embodiments the unassembled block copolymer layer portion may be contained or included generally within the confines of the upper interconnect line etch opening 210. The unassembled block copolymer layer portion may either not completely fill the opening or alternatively may overflow out of the opening as desired. It is also possible to include the layer over the top surface of the patterned upper hardmask layer although the present example does not show it because it is not needed to be formed there in this example of use.

The unassembled block copolymer layer portion includes a block copolymer material. The unassembled refers to the fact that the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed further below. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used.

FIG. 2E shows an assembled block copolymer layer portion 213 formed by microphase separation and/or self-assembly of the unassembled block copolymer layer portion 212 of the integrated circuit substrate of FIG. 2D. The microphase separation and/or self-assembly occur through rearrangement and/or repositioning of the block copolymer molecules, and in particular to rearrangement and/or repositioning of the different polymer blocks of the block copolymer molecules.

As shown in the cross-sectional view (on the left), in some embodiments, an annealing treatment 214 may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the integrated circuit substrate, heating the integrated circuit substrate in an oven or under a thermal lamp, applying infrared radiation to the block copolymer, or otherwise applying heat to or increasing the temperature of the block copolymer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of forces such as surface tension, molecular likes and dislikes, and other surface-related and chemical-related forces.

As best viewed in the cross-sectional view (on the left), the assembled block copolymer layer portion 213 includes a plurality of columns 215. The columns are formed or constructed predominantly of polymer blocks of a first type (e.g., blocks of polymer A). The columns are surrounded by polymer blocks 216 of a second type (e.g., blocks of polymer B). The microphase separation and/or self-assembly has caused the block copolymer molecules to rearrange so that the polymer blocks of the first type have microphase separated and/or self-assembled into the columns (i.e., columnar shaped regions) regions, whereas the polymer blocks of the second type have microphase separated and/or self-assembled predominantly around the columns but not substantially within the columns. As best viewed in the top-planar view (on the right), the assembled block copolymer layer portion is contained or included within the upper interconnect line etch opening 210. The patterned upper hardmask layer 209 is also visible around the perimeter of the opening 210. The tops of the columns 215 are visible in this view. In the illustrated embodiment, the tops of the columns are shown as being circular, although the scope of the invention is not so limited. The cross-sections of the columns may be circular, oval, square, rectangular, irregular shaped, or otherwise according to how the particular block copolymer is directed to self assemble. That is, columns is used in a broad sense herein that is not limited to circular cross-sectioned columns. Moreover, while it is often to use columns or columnar shapes for via openings, this is not required. Other via-like shapes or shapes suitable for vias may alternatively be used. For example, cuboids or rectangular cuboid nanostructures may be used. The scope of the invention is not particularly limited to the particular shape of the self-assembled polymer provided it is sufficient for forming a via opening suitable for the particular implementation.

Referring again to the top-planar view, the upper interconnect line etch opening generally corrals, constrains, or contains the block copolymer during self-assembly. The assembling block copolymer within the opening may have its self-assembled structures (e.g., the columns or lamellae) aligned and positioned relative to the dimensions of the upper interconnect line etch opening. The size and shape and placement of the upper interconnect line etch opening all tend to affect the positions of the columns. As shown in the illustrated embodiment, the upper interconnect line etch opening may be sufficiently narrow that there is a one-dimensional array or line of columns. The self-assembly may tend to cause the columns to be substantially evenly spaced apart from one another along a length of the upper interconnect line etch opening within the upper interconnect line etch opening. By way of example, the positions of the columns may be moved left or right by moving the upper interconnect etch opening line ends left or right, respectively. This may be used to help position the columns at appropriate locations relative to the lower interconnect lines. For example, as viewed in the illustration, the horizontal position of the columns and/or the alignment error in the horizontal direction relative to the lower interconnects 206 may be controlled by moving the horizontal positions of one or more ends of the upper interconnect line etch opening 210. That is, moving the leftmost end of the upper interconnect line etch opening to the left will help to move the columns to the left, etc. Properly aligning the upper interconnect line etch opening may be used to properly align the columns and therefore the via openings (as will be described further below). Accordingly, the columns also self-align in the horizontal direction. The horizontal direction may be generalized as the direction substantially orthogonal to the elongation direction of the lower interconnects 206.

Additionally, the self-assembly may tend to cause the columns to be substantially centered or centrally located within the width of the upper interconnect line etch opening. The assembling block copolymer within the opening may have its self-assembled structures (e.g., the columns) aligned and positioned relative to the upper interconnects that are to be formed using the upper interconnect line etch opening. That is the self-assembly process itself may tend to align or center the columns relative to the walls of the upper interconnect line etch opening. This is based on the self-assembly process not based on lithographical alignment which is difficult for extremely small vias and via pitches. The diameter (or other cross-sectional dimension) of the columns may be based at least in part upon the relative lengths of the polymer blocks of the block copolymer. The block copolymer used may be designed so that diameters of the columns as well as the pitch of the columns (center-to-center spacing between closest adjacent columns) is appropriate for the predetermined pitch of the lower interconnect lines 206. That is the array of columns may be designed to include columns that directly overly each of the lower interconnect lines 206. With the right design rules for the lower interconnect lines, and the upper interconnect lines, the vias may also be made to align to the lower interconnect lines completely removing any scanner overlay error (up to some value) from the via-metal overlay, assuming the lines for both the upper and lower interconnects are approximately perpendicular to one another. For example, to allow a single pitch or spacing between self-assembled structures to be used, the upper and lower interconnects may be arranged perpendicularly or orthogonally to one another. This is commonly already done for many interconnect layers. Also, the lower interconnects be arranged on grid and/or the distances between the centers of any two adjacent lower interconnect lines be an integral multiple of the minimum interconnect pitch. The upper interconnects above the vias may be smaller than about half this minimum interconnect pitch.

FIG. 2F shows a patterned photoresist layer 217 formed over the integrated circuit substrate of FIG. 2E. The patterned photoresist layer may be formed in a conventional way (e.g., through spin coating, baking, lithographic exposure, development, etc.). Commonly, one or more bottom-anti-reflective coatings (BARC) may optionally be included under the photoresist layer, although for simplicity in the illustration the BARC layer(s) is not shown. The patterned photoresist layer includes openings 218 that are selectively formed over a desired subset of the columns 215. In the illustrated embodiment, the openings are aligned over the second and fourth columns. The second and fourth columns are those which are aligned over the lower interconnect lines 206, as shown by the dashed lines in the cross-sectional view. As shown, in some embodiments, the openings in the photoresist may have larger diameters or other cross-sectional dimensions than the diameters or cross-sectional dimension of the columns. Although not required, this feature shows how smaller sized columns may be used in conjunction with larger critical dimension photoresist openings to form via openings with smaller dimensions than the critical dimensions that can be practically imaged using a given lithographic technology. As shown in the top-planar view, the photoresist openings may potentially be circular, although this is not required. Square, rectangular, or other shaped openings are also suitable. The openings expose the tops 215 of the desired subset of the columns of the first polymer blocks. In addition, the second polymer block 216 surrounding the columns is also exposed within the bottoms of the openings in the photoresist layer.

Figure 2G:
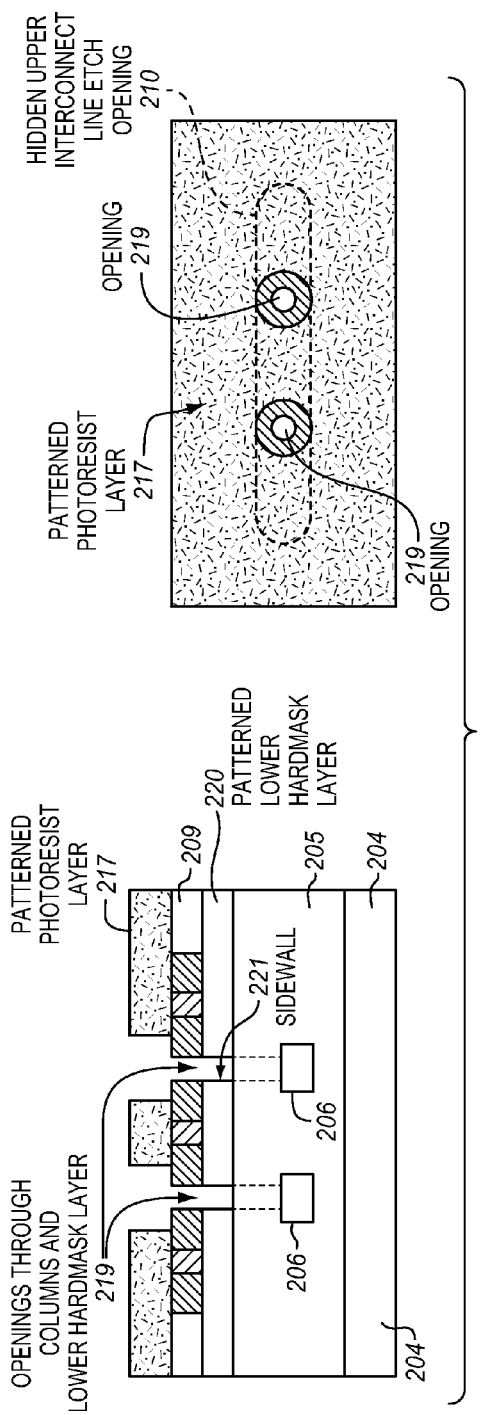

FIG. 2G shows openings 219 formed through the exposed columns 215 and through the lower hardmask layer 207 of the integrated circuit substrate of FIG. 2F to form a patterned lower hardmask layer 220. The openings through the columns may be formed in various different ways in different embodiments. In some embodiments, the openings through the columns may be formed by introducing an etchant through the openings of the photoresist layer and removing the exposed second and fourth columns by etching. In other embodiments, the openings through the columns (i.e., the second and fourth columns) may be formed by lithographic exposure through the openings in the patterned photoresist layer followed by development. The lithographic exposure may render the exposed second and fourth columns soluble in a developer solution. Any developer or etchant that is selective to remove the columns (e.g., the first polymer blocks) without substantially removing the second polymer blocks surrounding the columns may potentially be used. As used herein, selective means at least significantly more selective and includes also removing a limited amount of the second polymer blocks but to a much lesser extent and/or at a much lesser rate (e.g., at a rate that is at least an order of magnitude less). Generally, the walls of the openings through the columns may have a relatively clean profile because they are defined in part by the self-assembled interface between the first polymer blocks and second polymer blocks which may be controlled at the molecular level based on chemical interactions. For example, the openings may have smaller line width roughness (LWR) and critical dimension uniformity (CDU) than openings in a resist for such sizes.

After the openings through the exposed second and fourth columns of the first block polymer have been formed, the openings 219 through the patterned lower hardmask layer 220 may be formed directly below the openings in the columns. As best viewed in the cross-sectional view (on the left in the illustration), sidewalls 221 of the openings through the lower hardmask layer may be generally aligned vertically below sidewalls of the openings through the columns. In some embodiments, the openings through the patterned lower hardmask layer may be formed by etching the lower hardmask layer using the openings through the columns as an etch mask. Any etch that is selective to etch the lower hardmask layer preferentially over the second polymer block surrounding the openings through the columns may potentially be used. In some aspects, the etch may also be selective to not significantly etch the dielectric layer 205 so that the etch stops at or around the top of the dielectric layer. Alternatively, the timing of the etch may be precisely controlled so that the etch stops at or around the top of the dielectric layer. Note that the openings through the patterned lower hardmask layer have been formed using the openings through the columns, which have critical dimensions that are based on the self-assembly process (i.e., the sizes of the column structures) instead of being based on the critical dimensions of lithographically printed openings in photoresist. For example, the cross-sectional dimensions of the openings through the columns may be less than the cross-sectional dimensions of the openings through the patterned photoresist layer 218.

Figure 2H:
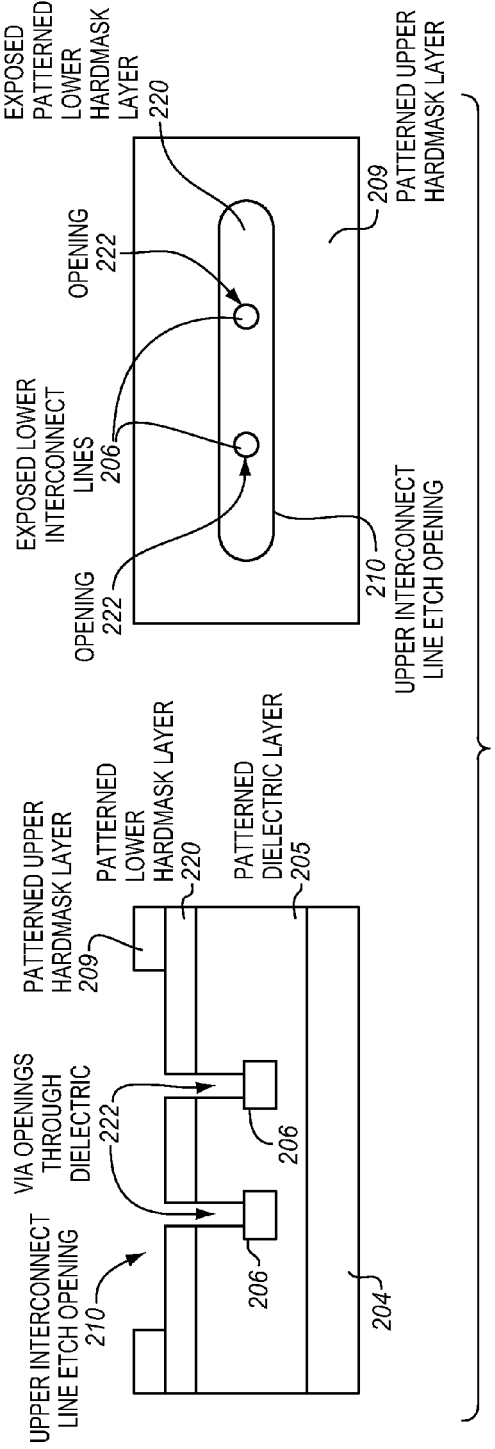

FIG. 2H shows removing the photoresist and the assembled block copolymer layer portion from the integrated circuit substrate of FIG. 2G. In some embodiments, the photoresist and the assembled block copolymer layer portion may be removed through a conventional photoresist stripping operation. In other embodiments, the depending upon the particular block copolymer, an additional operation may be used to finish removing any remaining block copolymer. For example, an additional or different strip operation may be performed, the surface may be contacted with a solvent, a wet etch may be performed, etc.

FIG. 2H also shows via openings 222 formed by etching through the dielectric layer 205 down to the lower interconnects 206 using the openings 219 in the patterned lower hardmask layer 220 as an etch mask. In the top-planar view (on the right), tops of the lower interconnect lines 206 are exposed at the bottom of these openings 222. As discussed above, while circular openings are shown in the illustrated embodiment, in other embodiments the openings may have square, rectangular, oval, irregular, or other shapes. Any etch capable of selectively etching the dielectric layer preferentially over the lower hardmask layer may potentially be used. The openings 222 in the dielectric layer 205 represent via openings, which as described further below will be filled with one or more metals or other conductive materials. In the illustrated embodiment, the via openings have been formed using the openings 219 in the patterned lower hardmask layer 220 as an etch opening. Recall that the openings in the lower hardmask layer were formed using the openings through the columns 215 as an etch opening. Accordingly, the via openings may be characterized with diameters or other cross-sectional dimensions that are based on those of the openings through the columns of the assembled block copolymer layer. As discussed elsewhere herein, this may potentially be used to form via openings with critical dimensions that are smaller than can be readily printed using a given lithography technology, although the scope of the invention is not limited in this regard.

Figure 2I:
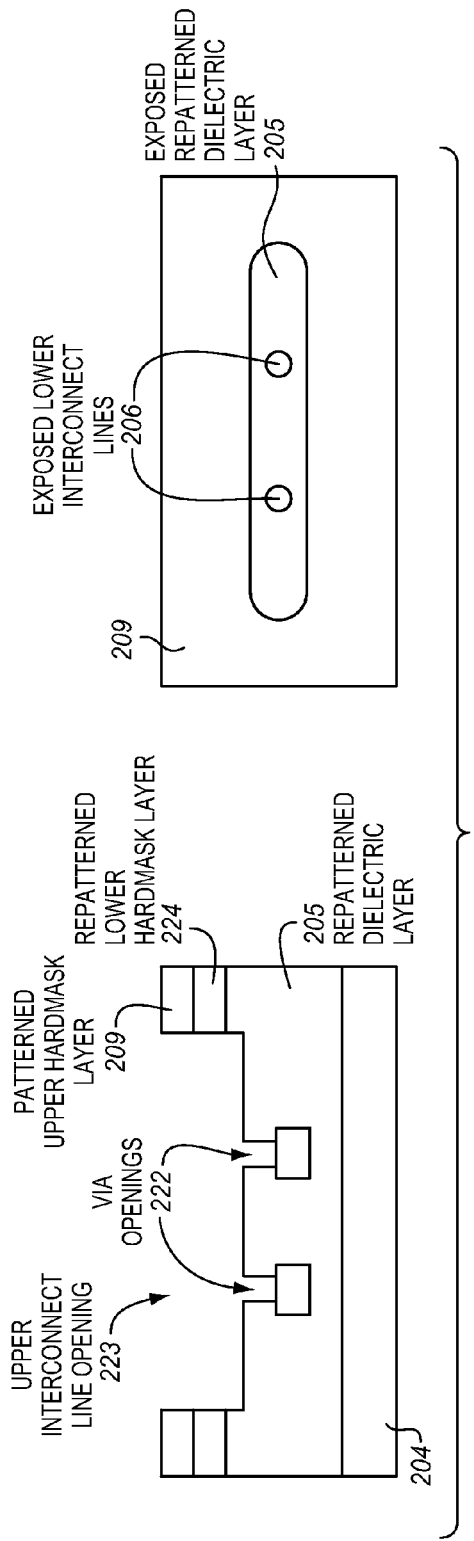

FIG. 2I shows an upper interconnect line opening 223 formed by etching through the patterned lower hardmask layer 220 and optionally partly into the patterned dielectric layer 205 of the integrated circuit substrate of FIG. 2H by using the upper interconnect line etch opening 210 as an etch opening. Often, the etch may be allowed to progress part way into the dielectric layer to allow the upper interconnect line to be at least partly embedded within the dielectric layer, although this is not required. As shown in the cross-sectional and top-planar views, in some embodiments the upper interconnect line opening (which is to contain the upper interconnect) may have substantially the same dimensions as the upper interconnect line etch opening used for the forming etch. In other embodiments, the upper interconnect line opening may have slightly increased dimensions relative to the upper interconnect line etch opening but are still substantially centered on those of the upper interconnect line etch opening. As a result, in some embodiments, the upper interconnect line opening (which is to hold the upper interconnect line) may have a central axis that is centered or at least substantially centered directly above a central axis of the upper interconnect line etch opening.

Figure 2J:
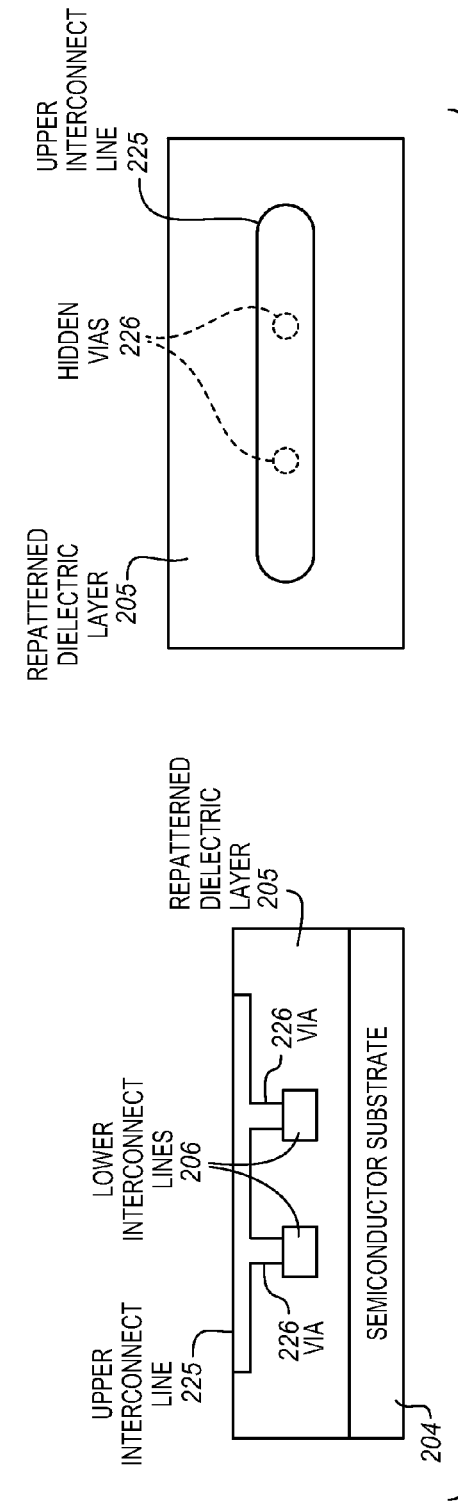

FIG. 2J shows an upper interconnect line 225 and vias 226 formed respectively in the upper interconnect line opening 223 and via openings 222 of the integrated circuit substrate of FIG. 2I. The upper interconnect line and the vias may be formed by introducing (e.g., through deposition and/or plating) one or more metals or other conductive materials into the corresponding openings. If desired, liner layers, barrier layers, and the like may optionally be used. The scope of the invention is not limited to any known design or materials for the upper interconnect line or the vias. The scope of the invention is not limited to any known approach for introducing one or more metals or other conductive materials into the corresponding openings. In some embodiments, the pitch of the vias may be less than about 60-70 nm, although the scope of the invention is not limited to such pitches. In some embodiments, the critical dimensions of the vias may be less than about 35 nm, although the scope of the invention is not limited to such critical dimensions. The patterned upper and lower hardmask layers have also been removed. They may be removed by conventional approaches known in the arts.

As discussed above, in some embodiments, the upper interconnect line opening 223 and/or the upper interconnect line 225 may have a central long axis (i.e., along a length of the upper interconnect line) that is centered, or at least substantially centered, directly aligned below corresponding a central axis of the upper interconnect line etch opening 210. As discussed above for FIG. 2E, the block copolymer 212 was corralled or contained within the upper interconnect line etch opening 210. The columns of the first polymer blocks were self-assembled relative to the upper interconnect line etch opening. For example, the columns were centered, or at least substantially centered or at least centrally located, within a width of the upper interconnect line etch opening. Accordingly, by extension the upper interconnect line and/or the upper interconnect line opening may also be aligned with the positions of the columns. By extension, the vias formed in the via openings formed using the columns may be aligned relative to the upper interconnect line and/or the upper interconnect line opening. As discussed above, such alignment may be provided in large part by the self-assembly of the block copolymer, rather than needing to rely on lithography for the alignment.

Figure 3A:
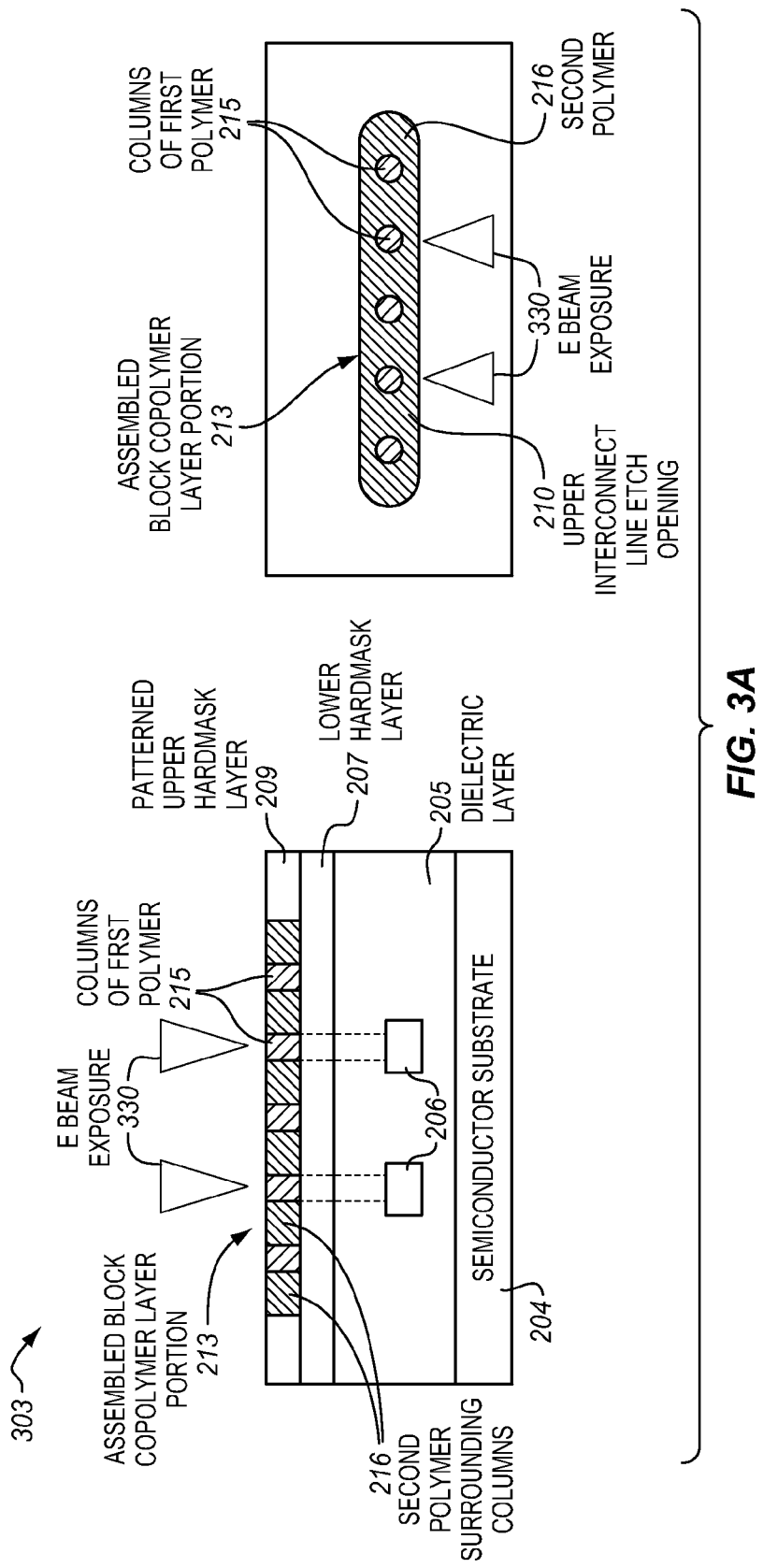
FIG. 3A-B illustrate portions of integrated circuit substrates representing different stages of an alternate embodiment of a method of forming openings through columns or other self-assembled block copolymer structures which may be used with the approach of FIG. 2A-J.
Figure 3B:
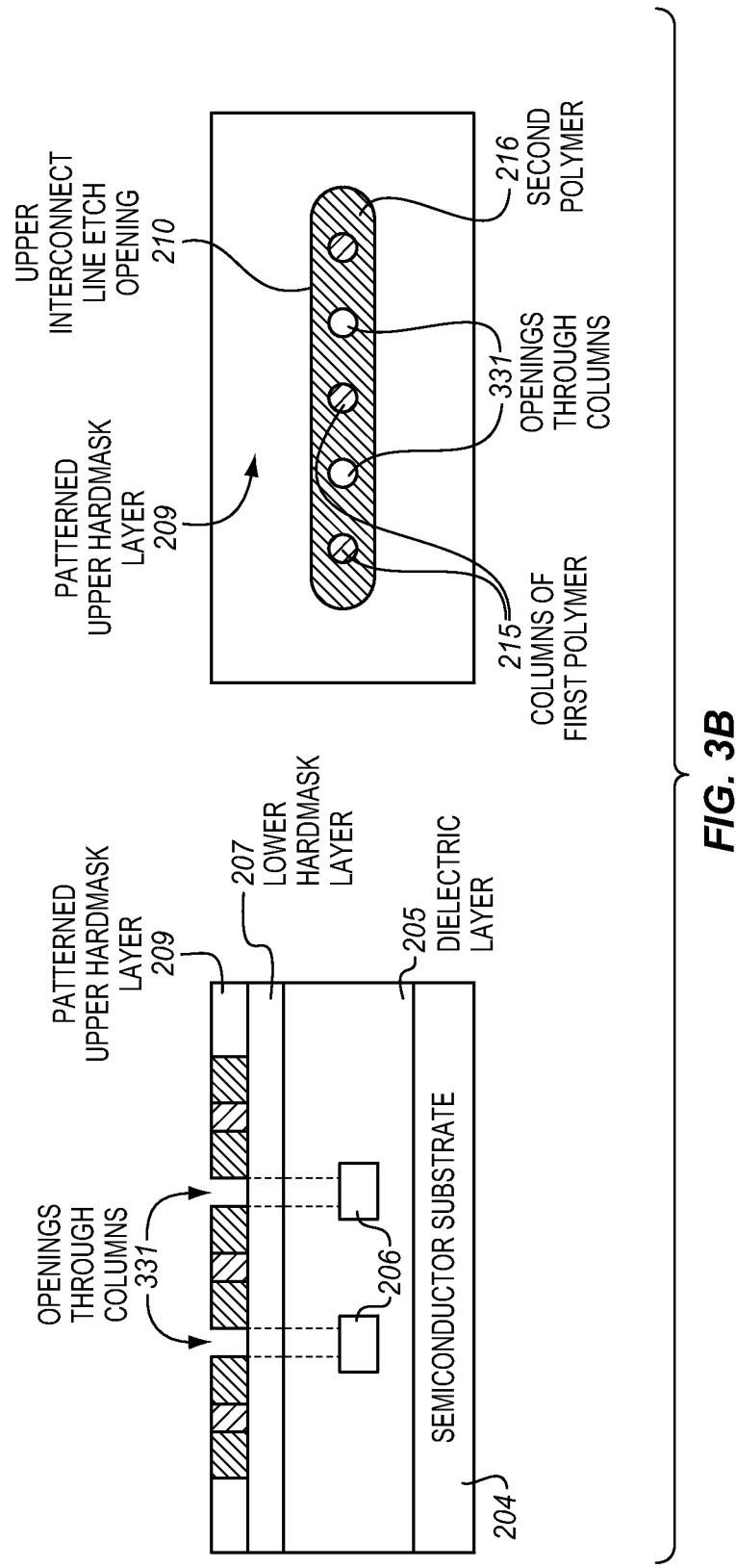

FIG. 3A-B illustrate portions of integrated circuit substrates representing different stages of an alternate embodiment of a method of forming openings through columns, or other self-assembled block copolymer structures, by using electron beam lithography. In some embodiments, the method of FIGS. 3A-B may be used in the method of FIG. 2A-J. Alternatively, the method of FIGS. 3A-B may be used in an entirely different method than that shown in FIG. 2A-J.

FIG. 3A shows an integrated circuit substrate 303 at a first stage of the method. The integrated circuit substrate 303 at this stage may be similar to or the same as that shown in FIG. 2E after the assembly has occurred (e.g., after annealing treatment 214). The integrated circuit substrate 303 includes a semiconductor substrate 204, a dielectric layer 205 formed over the semiconductor substrate 204, a lower hardmask layer 207 formed over the dielectric layer 205, and a patterned upper hardmask layer 209 formed over the lower hardmask layer 207. Lower interconnects 206 are formed within the dielectric layer 205. An assembled block copolymer layer portion 213 is formed in an upper interconnect line etch opening 210 within the patterned upper hardmask layer 209. The assembled block copolymer layer portion 213 has columns or other assembled structures 215 of first polymer blocks surrounded by second polymer blocks 216.

An electron beam (e-beam) 330 is used to selectively expose a subset of the columns 215 of the assembled block copolymer layer portion 213. In this case, the e-beam exposes the second and fourth columns which are directly aligned over the lower interconnect lines 206. For example, each e-beam may be slightly larger than the columns being exposed but small enough to not expose unintended adjacent columns. The columns may include first polymer blocks that are capable of being chemically altered or changed by the e-beam.

FIG. 3B shows openings 331 through the columns 215 formed by removing the e-beam exposed columns of the integrated circuit substrate of FIG. 3A. In some embodiments, the columns 215 may include first polymer blocks that are capable of being scissioned, broken from larger polymers into smaller polymers, or otherwise made selectively or preferentially soluble or removable (e.g., in a developer or other solvent) relative to the second polymer blocks 21. Examples of such polymer blocks include, but are not limited to, poly(methyl methacrylate) (PMMA) and other polymers used as e-beam resists or having similar characteristics to e-beam resists. For example, a PMMA-PS (polystyrene-poly(methyl methacrylate)) block copolymer may be used in one embodiment. In some embodiments, the columns after exposure to the e-beam may be capable of being selectively or preferentially dissolved or removed, for example by a developer or other solvent, over the second polymer blocks surrounding the columns. After the exposure to the e-beam, the assembled block copolymer layer portion 213 may be contacted with a developer during development, or exposed to another solvent, which may dissolve or otherwise remove the exposed second and fourth columns. In some embodiments, the openings 331 through the columns 215 may be used as etch openings to etch the lower hardmask layer 207, as previously described in conjunction with FIG. 2G. In some embodiments, remaining portions of the method may be as described above for FIGS. 2G-2J.

An advantage of such an e-beam approach is avoiding masks. This could make run times faster than for processes using masks due to the time for mask making. In addition, no photoresist is needed to expose the columns. Moreover, the line width roughness (LWR) and critical dimension uniformity (CDU) of the via openings may be better than for even pure PMMA resists, due in part to the chemical interface between the two different types of polymer blocks (e.g., the PMMA-PS interface) which generally tends to be relatively smooth, and due in part to avoiding development dynamics of a standard photoresist process which tends to increase LWR and CDU. It is noted that the registration of the vias is not significantly affected by the e-beam registration error but rather by the self-assembly process.

Figure 4:
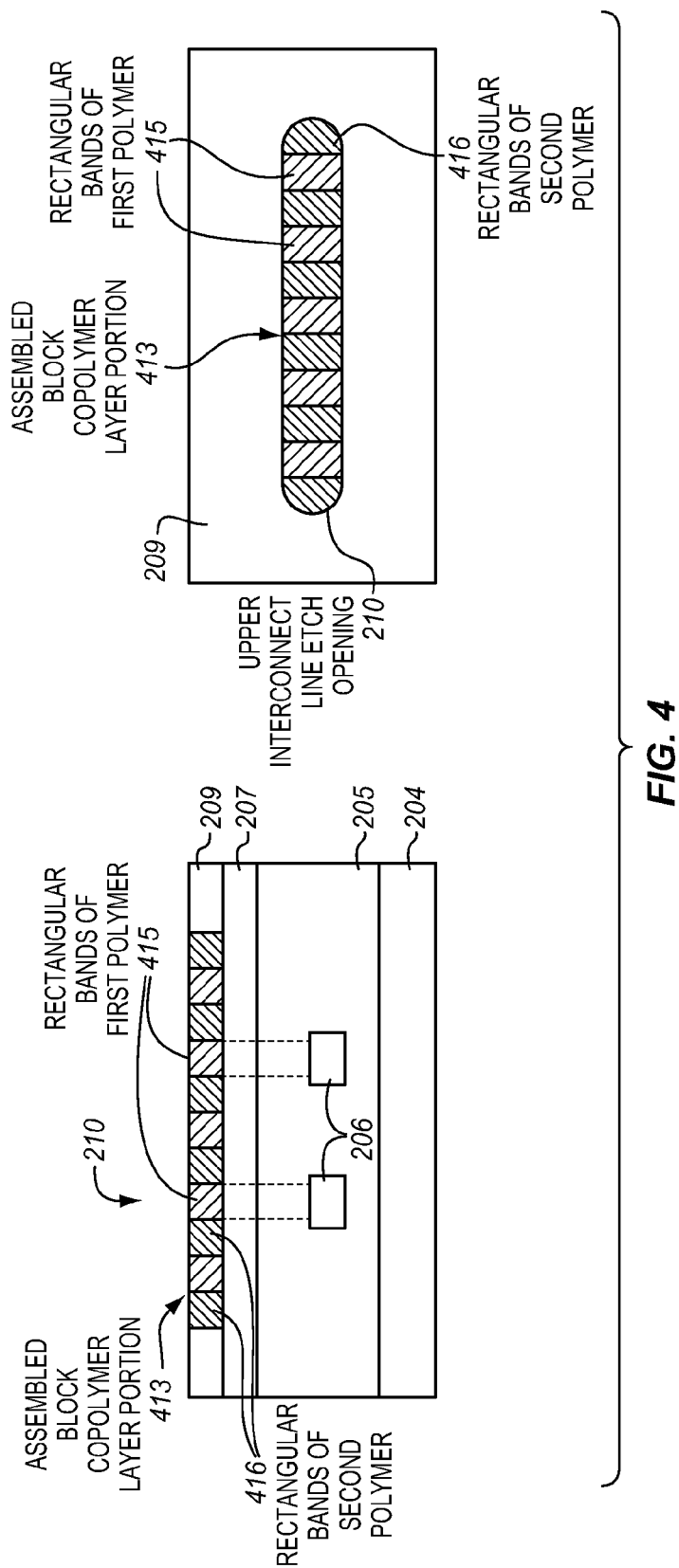
FIG. 4 illustrates an alternate embodiment of assembled structures.

FIG. 4 illustrates a portion of an integrated circuit substrate 403 at a stage of a method of forming via openings that is similar to that shown in FIG. 2E. As best viewed in the cross-sectional view (on the left in the illustration), the integrated circuit substrate includes a semiconductor substrate 204, a dielectric layer 205 having lower interconnect lines 206 disposed therein, a lower hardmask layer 207, a patterned upper hardmask layer 209, and an embodiment of an assembled block copolymer layer portion 413 in an upper interconnect line etch opening 210 in the patterned upper hardmask layer. As before, an annealing treatment (not shown) may optionally be provided to encourage the assembly of the block copolymer layer.

In the illustrated embodiment, the assembly of the block copolymer layer portion 413 has generated generally square or rectangular bands of polymer blocks of a first type 415 which are separated from one another or alternate with intervening rectangular bands of polymer blocks of a second different type 416. Each of the bands spans a full width of the interconnect line etch opening 210. By way of example, the bands may represent lamellar structures or fine layers that alternate between different materials. In some embodiments, such bands may be formed by block copolymer in which the relative lengths of first and second blocks of polymers are approximately the same or at least commensurate with one another, although the scope of the invention is not so limited. One potential advantage of the bands is increased contact area with the lower interconnect lines in the direction into the plane of the page and/or the elongation direction of the lower interconnect lines.

In some embodiments, ends of the upper interconnect line etch opening may optionally be treated differently (e.g., with a different conformal brush material/layer or other surface treatment 211) than other portions of the upper interconnect line etch opening between the ends. For example, the surface treatment on the ends may be relatively more non-neutral to one of the polymer blocks (e.g., a polymer block to be used aligned over the lower interconnects) than another, whereas the surface treatment on other portions of the upper interconnect line etch opening between the ends (e.g., on a bottom and sidewalls of the upper interconnect line etch opening between the ends) may be relatively more neutral to each of the different polymer blocks. Such different surface treatments, which are optional, may help to promote or favor one of the polymer blocks to be adjacent the ends of the upper interconnect line etch opening preferentially over the other. This may help to provide control or direct the self assembly of the structures to occur at intended locations.

The assembled structures shown and described for FIG. 4 may be used with other embodiments disclosed elsewhere herein. For example, the assembled structures of FIG. 4 may be used with the approach shown in FIGS. 2A-J and 3A-B. The stage of FIG. 4 is similar to the stage of FIG. 2E. Operations prior to FIG. 2E and/or operations after FIG. 2E may be used along with the embodiment of FIG. 4. Moreover, the embodiments of FIGS. 3A-B may be used with the embodiment of FIG. 4.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
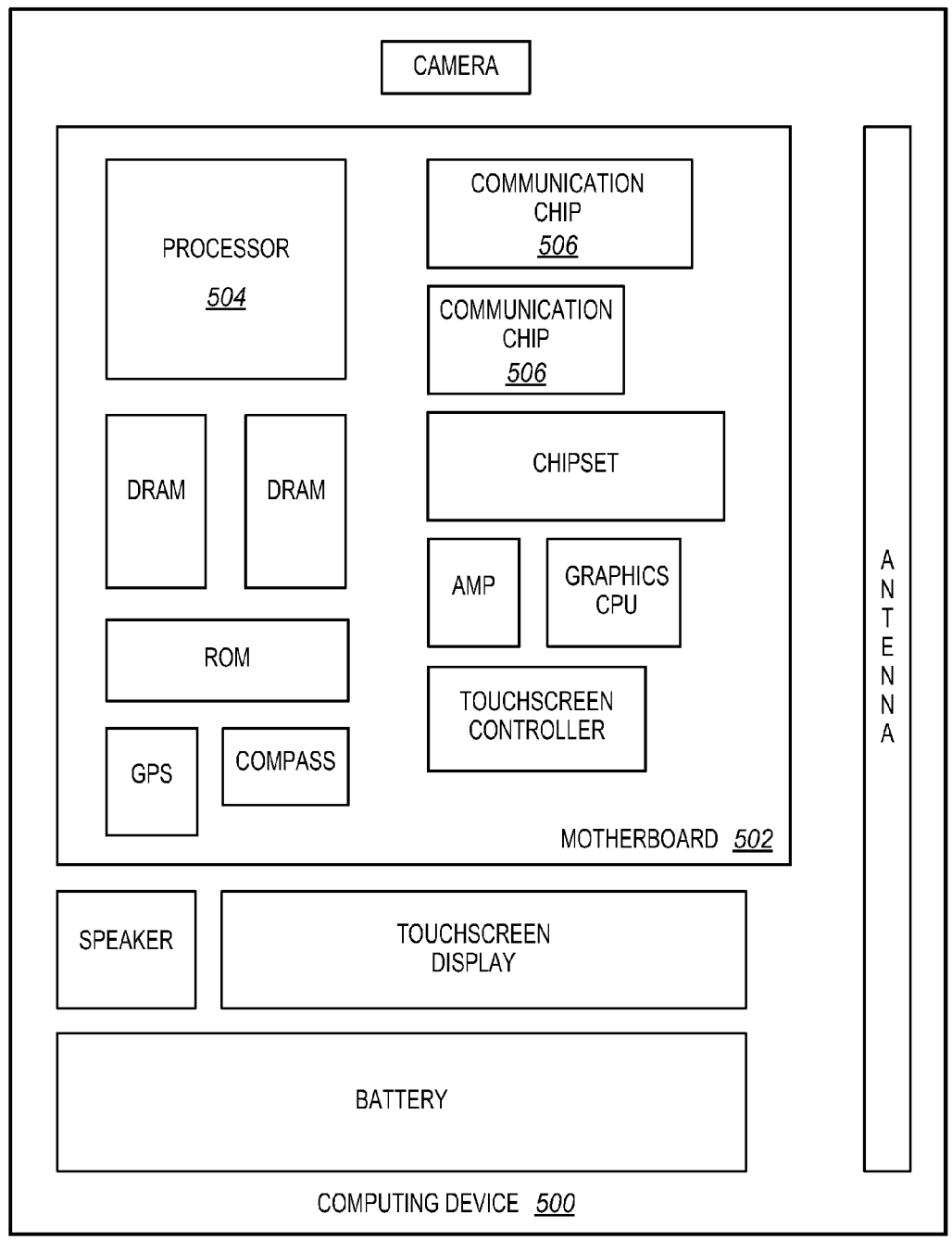
FIG. 5 illustrates a computing device in accordance with one implementation of the invention.

FIG. 5 illustrates a computing device 500 in accordance with one implementation of the invention. The computing device houses a board 502. The board may include a number of components, including but not limited to a processor 504 and at least one communication chip 506. The processor is physically and electrically coupled to the board. In some implementations the at least one communication chip is also physically and electrically coupled to the board. In further implementations, the communication chip is part of the processor.

Depending on its applications, computing device may include other components that may or may not be physically and electrically coupled to the board. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The processor 504 of the computing device includes an integrated circuit die packaged within the processor. In some implementations of the invention, the integrated circuit die of the processor includes one or more devices, such as via openings formed using directed self assembly of block copolymers as described elsewhere herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip. In accordance with another implementation of the invention, the integrated circuit die of the communication chip includes one or more devices, such as via openings formed using directed self assembly of block copolymers as described elsewhere herein.

In further implementations, another component housed within the computing device may contain an integrated circuit die that includes one or more devices, such as via openings formed using directed self assembly of block copolymers as described elsewhere herein.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description. It will also be appreciated, by one skilled in the art, that modifications may be made to the embodiments disclosed herein, such as, for example, to the sizes, shapes, configurations, forms, functions, and materials, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods. In addition, while the flow diagrams show a particular order of the operations according to example embodiments, it is to be understood that that particular order is exemplary. Alternate embodiments may optionally perform the operations in different order, combine certain operations, overlap certain operations, etc. Many modifications and adaptations may be made to the methods and are contemplated.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   forming an opening in a hardmask layer over a dielectric layer, the hardmask layer having a bottommost surface and an uppermost surface;
   introducing a block copolymer in the opening in the hardmask layer;

assembling the block copolymer to form a plurality of assembled structures that are spaced along a length of the opening in the hardmask layer, wherein the plurality of assembled structures is confined to and co-planar with the opening in the hardmask layer and has a bottommost surface co-planar with the bottommost surface of the hardmask layer and has an uppermost surface co-planar with the uppermost surface of the hardmask layer;

forming an opening through an assembled structure of the plurality of assembled structures;

forming a first opening in the dielectric layer, the first opening having a cross-sectional dimension that is based on a cross-sectional dimension of the opening through the assembled structure;

subsequent to forming the first opening in the dielectric layer, forming a second opening in the dielectric layer by using the opening in the hardmask layer as a mask; and subsequent to forming the second opening in the dielectric layer, filling the first and second openings in the dielectric layer with a conductive material.

2. The method of claim 1, wherein assembling comprises assembling a single line of the plurality of assembled structures with each of the plurality of assembled structures centrally located within a width of the opening in the hardmask layer.

3. The method of claim 1, wherein forming the opening through the assembled structure comprises performing an etch that that is operable to selectively etch a material of the assembled structure over a material surrounding the assembled structure.

4. The method of claim 1, wherein forming the opening through the assembled structure comprises exposing the assembled structure to an electron beam that is operable to scission a material of the assembled structure more than a material surrounding the assembled structure.

5. The method of claim 4, wherein exposing the assembled structure comprises exposing a PMMA material of the assembled structure.

6. The method of claim 1, wherein assembling comprises forming the plurality of assembled structures that each include a polymer material that is operable to be scissioned by an electron beam exposure, and wherein each of the plurality of assembled structures is surrounded by a polymer material that is not operable to be scissioned by the electron beam exposure.

7. The method of claim 1, wherein the block copolymer comprises alternating blocks of polymer A and polymer B.

8. A method comprising:

forming an opening in a hardmask layer over a dielectric layer, the hardmask layer having a bottommost surface and an uppermost surface;

introducing a block copolymer in the opening in the hardmask layer;

assembling the block copolymer to form a plurality of assembled structures that are spaced along a length of the opening in the hardmask layer, wherein the plurality of assembled structures is confined to the opening in the hardmask layer and has a bottommost surface co-planar with the bottommost surface of the hardmask layer and has an uppermost surface co-planar with the uppermost surface of the hardmask layer;

forming an opening through an assembled structure of the plurality of assembled structures;

forming a first opening in the dielectric layer, the first opening having a cross-sectional dimension that is based on a cross-sectional dimension of the opening through the assembled structure;

subsequent to forming the first opening in the dielectric layer, forming a second opening in the dielectric layer by using the opening in the hardmask layer as a mask; and subsequent to forming the second opening in the dielectric layer, filling the first and second openings in the dielectric layer with a conductive material.

9. The method of claim 8, wherein assembling comprises assembling a single line of the plurality of assembled structures with each of the plurality of assembled structures centrally located within a width of the opening in the hardmask layer.

10. The method of claim 8, wherein forming the opening through the assembled structure comprises performing an etch that that is operable to selectively etch a material of the assembled structure over a material surrounding the assembled structure.

11. The method of claim 8, wherein forming the opening through the assembled structure comprises exposing the assembled structure to an electron beam that is operable to scission a material of the assembled structure more than a material surrounding the assembled structure.

12. The method of claim 11, wherein exposing the assembled structure comprises exposing a PMMA material of the assembled structure.

13. The method of claim 8, wherein assembling comprises forming the plurality of assembled structures that each include a polymer material that is operable to be scissioned by an electron beam exposure, and wherein each of the plurality of assembled structures is surrounded by a polymer material that is not operable to be scissioned by the electron beam exposure.

14. The method of claim 8, wherein the block copolymer comprises alternating blocks of polymer A and polymer B.

* * * * *